United States Patent
Allouche et al.

(10) Patent No.: US 11,487,923 B2
(45) Date of Patent: Nov. 1, 2022

(54) METHOD FOR SIMULATING A QUANTUM CIRCUIT, ON A CLASSICAL COMPUTER

(71) Applicant: BULL SAS, Les Clayes sous Bois (FR)

(72) Inventors: Cyril Allouche, Les Clayes sous Bois (FR); Minh Thien Nguyen, Les Clayes sous Bois (FR)

(73) Assignee: BULL SAS, Les Clayes sous Bois (FR)

( * ) Notice: Subject to any disclaimer, the term of this patent is extended or adjusted under 35 U.S.C. 154(b) by 345 days.

(21) Appl. No.: 16/497,004

(22) PCT Filed: Mar. 19, 2018

(86) PCT No.: PCT/FR2018/000057
§ 371 (c)(1),
(2) Date: Sep. 24, 2019

(87) PCT Pub. No.: WO2018/172629
PCT Pub. Date: Sep. 27, 2018

(65) Prior Publication Data
US 2021/0103692 A1    Apr. 8, 2021

(30) Foreign Application Priority Data

Mar. 24, 2017  (FR) ...................................... 1770299

(51) Int. Cl.
*G06F 30/33* (2020.01)
*G06N 10/00* (2022.01)

(52) U.S. Cl.
CPC ............. *G06F 30/33* (2020.01); *G06N 10/00* (2019.01)

(58) Field of Classification Search
CPC .......... G06F 30/33; G06F 30/00; G06F 30/32; G06F 30/30; G06N 10/00
USPC ...................................................... 703/14, 13
See application file for complete search history.

(56) References Cited

FOREIGN PATENT DOCUMENTS

| WO | WO-2014015200 A1 * | 1/2014 | ............. B82Y 10/00 |
| WO | WO-2017095652 A1 * | 6/2017 | ............. G06F 7/503 |

OTHER PUBLICATIONS

Frank, Michael P. et al., "Space-Efficient Simulation of Quantum Computers", Mar. 19-21, 2009, ACMSE '09, ACM. (Year: 2009).*

(Continued)

*Primary Examiner* — Cedric Johnson
(74) *Attorney, Agent, or Firm* — Meagher Emanuel Laks Goldberg & Liao, LLP

(57) ABSTRACT

A Method for simulating, on a computer processing unit including a semiconductor integrated circuit, the operation of a quantum circuit model, which includes the operations of: dividing the quantum circuit into d adjacent layers $L_k$ intended to be successively traversed by the n qubits taken together, each layer including a single quantum gate $G_k$; and assigning a type to each quantum gate $G_k$ of the circuit, among three predefined types of quantum gates. The three types are: Diagonal type gate, for which the transfer matrix is diagonal; Conventional type gate, for which the transfer matrix is non-diagonal and includes operators having a value of 0 or 1, with only one operator per row and per column; and Dense type gate, which is neither conventional nor diagonal in type.

1 Claim, 1 Drawing Sheet

(56) References Cited

OTHER PUBLICATIONS

Frank et al., "Space-Efficient Simulation of Quantum Computers," Mar. 19, 2009, ACMSE '09, pp. 1-6.
Nielsen & Chuang, "Quantum Computation and Quantum Information," 2010, pp. 16-21, Cambridge University Press.
Benenti et al, "Principles of Quantum Computation and Information", vol. I: Basic Concepts, World Scientific Publishing Co, 2004.
Lomonaco, Jr., et al., "Shor's Quantum Factoring Algorithm", Proceedings of Symposia in Applied Mathematics, University of Maryland, pp. 1-19, 2000.
Gerdt et al., "A Mathematica Program for Constructing Quantum Circuits and Computing Their Unitary Matrices", Workshop on Quantum Physics and Communication, Oct. 15-19, 2007.
Patrzyk et al., "Towards a Novel Environment for Simulation of Quantum Computing", Computer Science, vol. 16, No. 1, pp. 103-129, 2015.
Nielsen et al., "Quantum Computation and Quantum Information", Cambridge University Press, 10th Anniversary Edition, pp. 109, 2010.
Samad et al., "Memory Efficient Quantum Circuit Simulator Based on the Linked List Architecture", , 2005.

\* cited by examiner

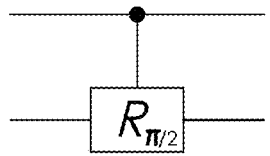
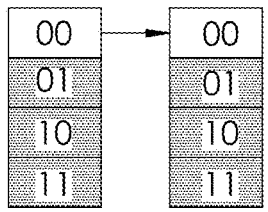
FIG.1      FIG.2      FIG.3
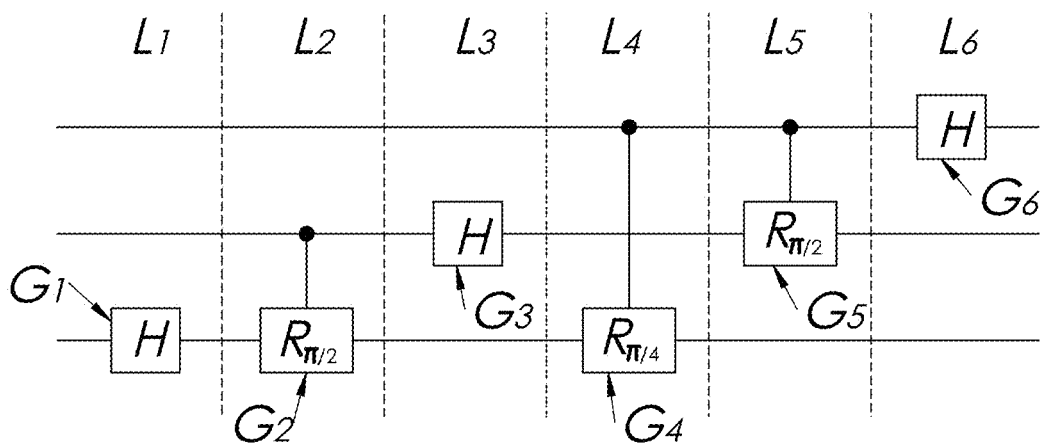
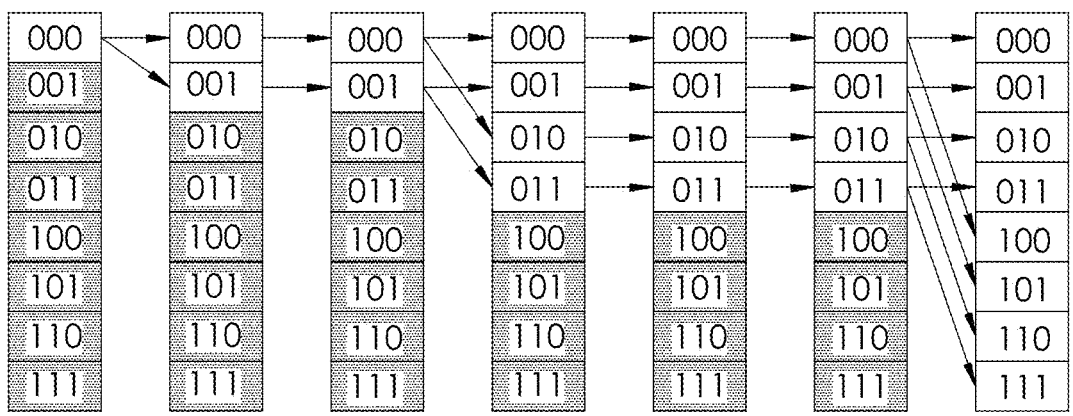
FIG.4

METHOD FOR SIMULATING A QUANTUM CIRCUIT, ON A CLASSICAL COMPUTER

The invention relates to the field of computer science, and more specifically to the simulation of a quantum logic circuit by means of a classically structured computer—in other words using processors comprising logic gates each consisting of a circuit of transistors that can be traversed by flows of electrons.

The design of a computer (which can be likened to a processor, the two terms being synonymous here) is generally based on a prior phase of algorithmic simulation of its operation (in other words the operation of its component logic circuits) in order to predict the general behavior, and more particularly the results that the computer would provide after executing a given program.

Operations (for example addition, subtraction, multiplication) are carried out by combinations of basic logic gates based on transistors, which perform logic functions applied to input bits (of value 0 or 1) and whose results are output bits (of value 0 or 1). For example, we can cite the logic functions NOT, AND, OR, NOR, NAND.

The miniaturization of transistors, made possible by the increasing sophistication of semiconductor etching processes, has made it possible to multiply the computing power and the storage capacity (or memory) of computers. According to Moore's conjecture (the so-called Law), the density of transistors etched on a semiconductor would more or less double every two years since the 1960s.

As long as transistors remain at the micrometric scale, classical physics (with the laws of electricity) remains applicable, and the functions performed by logic gates remain deterministic, which makes it possible to apply simple, linear algebra in the simulation algorithm.

In a classical computer (in the sense that it comprises transistors operating in accordance with the laws of electricity of classical physics), the output (meaning the result) of a program requiring n input bits (each of value 0 or 1) can be modeled by a state vector having $2^n$ components, which represents the set of possible values of the output bits.

It is therefore understood that the addition of an input bit leads to multiplying by 2 the number of possible values of the output bits. In other words, any linear increase of the inputs (addition of bits) results in an exponential increase in the computing capacity (and/or memory) required.

In light of increasing application requirements (for example computer-assisted medicine, the driving of autonomous vehicles, high-definition image processing), the miniaturization of logic circuits is being pursued and nanometric and even atomic scales are currently being achieved.

At these scales, information is no longer conveyed by electrical flows whose behavior can be determined and predicted by the laws of classical physics, but by particles (or quanta) whose behavior, largely probabilistic, responds to the laws of quantum physics.

In a quantum computer, it is the qubit (contraction of quantum bit) which represents the basic unit for storing information, analogous to the bit which represents the basic unit for storing information in a classical computer.

Whereas the value of a bit is always—and permanently—0 or 1 depending on the operation applied to it (identity: 0→0 or 1→1; NOT: 0→1 or 1→0), the value of a qubit is indeterminate because probabilistic.

A fairly clear definition of the qubit is proposed by Benenti et al, in *Principles of Quantum Computation and Information, Volume I: Basic Concepts*, World Scientific Publishing Co, 2004. According to this definition, a qubit is a quantum system whose state is described by a wave function ψ, denoted $|\psi\rangle$ according to the Bra-ket notation of Dirac, in a Hilbert space. The wave function $|\psi\rangle$ is written as a linear combination of the possible values of the qubit:

$$|\psi\rangle = \alpha|0\rangle + \beta|1\rangle$$

where $|0\rangle$ and $|1\rangle$ represent the values 0 and 1 (or base state) of a classical bit, and where the coefficients α and β, called "probability amplitudes", are complex numbers normalized according to the following relation:

$$|\alpha|^2 + |\beta|^2 = 1$$

From a geometric point of view, a qubit can be represented by a point positioned on the surface of a Bloch sphere (of radius 1), for which the spherical coordinates are θ (0≤θ≤π) and ϕ (0≤ϕ≤2π).

Under these conditions, the state $|\psi\rangle$ of the qubit can be written as the following equation:

$$|\psi\rangle = \cos\frac{\theta}{2}|0\rangle + e^{i\phi}\sin\frac{\theta}{2}|1\rangle$$

. . . or as the following state vector:

$$|\psi\rangle = \begin{pmatrix} \cos\frac{\theta}{2} \\ e^{i\phi}\sin\frac{\theta}{2} \end{pmatrix}$$

These equations counter-intuitively attest to a continuity of the state of the qubit, which can take an infinity of states as long as it is not measured: from that moment on, its value is determined (0 or 1). This continuity means that in theory a single qubit is able to store an infinite amount of information, which gives hope for a quantum computer of particularly attractive performance in terms of computation and storage, even as its compactness renders it attractive as an object.

However, the laws of quantum mechanics freeze the state of the qubit as soon as it is read; it is impossible to figure out the values of amplitudes α and β, and therefore impossible to know the instantaneous state of the qubit.

In the current state of knowledge, qubits are intended to be used in a manner analogous to classical bits, in other words to be combined into a register of n qubits (n being an integer) that can be processed within a computer program.

The state of n qubits is described by a generalized wave function $|\psi\rangle$ in a Hilbert space with $2^n$ dimensions:

$$|\psi\rangle = \sum_{i=0}^{2^n-1} \alpha_i|i\rangle$$

where $|i\rangle$ represents the possible values (or base states) of classical bit combinations, and where the coefficients $\alpha_i$ are the probability amplitudes of each value, normalized according to the following relation:

$$\sum_{i=0}^{2^n-1} |\alpha_i|^2 = 1$$

Thus, for two qubits (n=2):

$$|\psi\rangle = \alpha_0|00\rangle + \alpha_1|01\rangle + \alpha_2|10\rangle + \alpha_3|11\rangle$$

where:

$$|\alpha_0|^2 + |\alpha_1|^2 + |\alpha_2|^2 + |\alpha_3|^2 = 1$$

Unlike a classical computer processing a single state of the register among all of its possible states, the quantum computer is theoretically capable of simultaneously processing all possible states of the register, meaning $2^n$. In other words, the quantum computer by its very nature performs its calculations in parallel. As a result, the addition of a qubit multiplies the computing power of the computer by 2, this therefore being an exponential function of the size of the register. To illustrate, it is sufficient to indicate that for n=300 (in other words 300 qubits), the size of the register—and therefore the number of states (each one characterizing information) of the register that the computer can process simultaneously—is $2^{330} \cong 10^{90}$, which corresponds to the estimated number of particles in our observable universe.

In the near future, it is realistic to expect quantum computers to be able to solve problems that are currently unsolvable by classical computers because of the unreasonable computing capacity that would need to be mobilized—and the computing time required.

A well-known example of a mathematical problem that classical algorithms running on classical computers are failing to solve within reasonable times is the factoring of a natural number N (typically 15=3×5). It is this relative inability of classical computers to solve the factorization problem that has enabled the use of RSA (Rivest-Shamir-Aldeman) cryptography, in which the generation of public keys relies on the product of integers.

Shor's quantum algorithm (for example, see a presentation of this algorithm in *Shor's Quantum Factoring Algorithm, Proceedings of Symposia in Applied Mathematics*, University of Maryland, 2000, by Lomonaco) allows—in theory—solving the problem of factorization of a natural integer N within a time whose order of magnitude is asymptotically algorithmic, meaning (in Landau's "Big O" notation), on the order of O(log(N)). The Shor algorithm relies on the use of a quantum Fourier transform, whose efficiency is much higher than that of classical Fourier transforms.

One can therefore see the attraction of modeling quantum logic circuits on classical computers, as of now. However, memory space and computing power are limiting factors.

Thus, a known modeling of a quantum logic circuit with n qubits consists of mathematically representing this circuit by a matrix (denoted U, called the Operation Matrix) of size $2^n \times 2^n$ which, applied to an initial state vector E of size $2^n$, outputs a final state vector E', also of size $2^n$ and a matrix product of E by U:

$$E' = U \cdot E$$

This modeling is tested in particular in Gerdt et al, *A Mathematica Program for Constructing Quantum Circuits and Computing Their Unitary Matrices*, Workshop on Quantum Physics and Communication, October 2007.

However, Patrzyk et al., in *Towards a Novel Environment for Simulation of Quantum Computing*, Computer Science 16 (1) 2015, 103-129, evaluated the memory capacity (corresponding to the number of bits that can be stored in memory) needed for a classical computer to simulate a given number of qubits (and more precisely to store the operation matrix), and provided a list of interesting numerical examples presented in the table (Table 1 p. 106) reproduced below (the memory is indicated in bytes, the prefixes k, M, and T respectively corresponding to the operators kilo, Mega, and Tera):

| Number of qubits | 5 | 10 | 20 | 21 |
|---|---|---|---|---|
| Memory (state vector) | 512 B | 16 kB | 16 MB | 32 MB |
| Memory (operation matrix) | 16 B | 16 MB | 16 TB | 64 TB |

It can be shown that, if we write as N the memory capacity of a classical computer that is required to store the operation matrix U, the maximum number, denoted $n_m$, of simulated qubits is not greater than:

$$\frac{\log(N)}{2\log(2)}$$

A known technique for reducing the memory capacity required for the computation (or, at equivalent memory capacity, to increase the number $n_m$ of simulated qubits), consists of making an approximation of the operation matrix U by reducing its size by means of a Schmidt decomposition, the methodology of this being described in particular in the reference work by A. Nielsen & I. Chuang: *Quantum Computation and Quantum Information*, Cambridge University Press, 10th Anniversary Edition, 2010, p. 109 and subsequent pages. In practice, however, although this approximation can provide acceptable results for some simple quantum circuits (for example for an AND logic gate), it is severely lacking in robustness for more complex circuits (for example for a quantum Fourier Transform circuit).

Samad and Al, in *Memory Efficient Quantum Circuit Simulator Based on the Linked List Architecture*, 2005, propose doing away with storing the complete matrix (denoted U above) of the quantum logic circuit, by purporting to subdivide it into columns and by successively obtaining the scalar product of each column with the state vector representing the input qubits, the columns being progressively erased from memory as their scalar product is obtained (see *Efficient implementation*, p. 4-5). However, while claiming to have successfully applied this method to Shor's algorithm, and while claiming to have been able to simulate 20 qubits within a reasonable amount of time, Samad does not provide any details for this method.

We therefore see that the need remains for a quantum circuit simulation (running on a classical computer) that is capable of better performances in comparison with known simulations, and more specifically is able to account for:
either a greater number of qubits at equivalent memory capacity,
or the same number of qubits at a more reasonable memory capacity.

For this purpose, a method is provided for simulating, on a computer processing unit comprising a semiconductor integrated circuit, the operation of a quantum circuit model configured to process a predefined number n (n being an integer such that n≥2) of input qubits and comprising a series of d (d being an integer such that d≥2) basic quantum gates $G_k$ (k being an integer, 1≤k≤d) selected from a library of predefined quantum gate models stored in a semiconductor integrated circuit memory, each quantum gate model being associated with a transfer matrix $U_k$ comprising operators ordered in rows and columns and defining the set of possible state transitions of qubits passing through this gate, this method comprising:

a phase of configuring the quantum circuit, which comprises the operations of:
  defining the number n of qubits to be processed as input to the quantum circuit model;
  selecting the d quantum gate models;
  arranging the d quantum gate models thus selected so as to construct the quantum circuit model;

a phase of analyzing the quantum circuit model so configured, which comprises the operations of:
  dividing the quantum circuit into d adjacent layers $L_k$ intended to be successively traversed by the n qubits taken together, each layer comprising a single quantum gate;
  assigning a type to each quantum gate of the circuit, among three predefined types of quantum gates:
    Diagonal type gate, for which the transfer matrix is diagonal;
    Conventional type gate, for which the transfer matrix is non-diagonal and comprises operators having a value of 0 or 1, with only one operator per row and per column;
    Dense type gate, which is neither conventional nor diagonal in type;

a phase of calculation, which comprises the repetition, for j=1 to j=$2^n$ (j being an integer), of the following operations:

a) defining a state vector $|\psi_j\rangle$ of the n qubits entering the quantum circuit, which comprises a series of $2^n$ amplitude coefficients $\alpha_i^j$ (i being an integer, $0 \le i \le 2^n - 1$) having a value of 0 or 1, and such that:

$$\sum_{i=0}^{2^n-1} |\alpha_i^j|^2 = 1$$

b) repeating the following sequence, for k=1 to k=d:
  b1) taking into account a state vector $|\psi_k^j\rangle$ of the n qubits entering layer $L_k$, this vector $|\psi_k^j\rangle$ comprising a series of $2^n$ amplitude coefficients $\alpha_i^{j,k}$;
  b2) identifying the gate $G_k$ comprised in layer $L_k$;
  b3) taking into account the type of gate $G_k$;
  b4) if the gate $G_k$ is of the diagonal type, assigning to the state vector $|\psi_{k+1}^j\rangle$ of the n qubits exiting layer $L_k$ the value of the state vector $|\psi_k^j\rangle$ of the n qubits entering it:

$$|\psi_{k+1}^j\rangle = |\psi_k^j\rangle$$

b5) if the gate $G_k$ is of the conventional type:
    detecting in its transfer matrix each operator having a value of 1 and determining its row number l and its column number c (l and c being integers such that $0 \le l \le 2^n$, $0 \le c \le 2^n$ and $l \ne c$);
    assigning the following values to the amplitude coefficients $\alpha_i^{j,k+1}$ of the state vector $|\psi_{k+1}^j\rangle$ of the n qubits exiting layer $L_k$:

$\alpha_i^{j,k+1} = \alpha_i^{j,k}$ for all $i \ne l$ $\alpha_l^{j,k+1} = \alpha_c^{j,k}$ storing the vector $|\psi_{k+1}^j\rangle$ in a dedicated register of a semiconductor integrated circuit memory;

b6) if the gate $G_k$ is of the dense type:
    determining the set of possible values of the state vector lip $|\psi_{k+1}^j\rangle$ of the n qubits exiting layer $L_k$ such that:

$$|\psi_{k+1}^j\rangle = U_k \cdot |\psi_k^j\rangle$$

storing each possible value of the vector $|\psi_{k+1}^j\rangle$ in a dedicated register of a semiconductor integrated circuit memory;

c) aggregating, in a single register of a semiconductor integrated circuit memory, the set of possible states of the vector $|\psi_{d+1}^j\rangle$.

This method makes it possible to simulate a quantum circuit more efficiently (in other words more quickly, and while mobilizing less memory space), compared to known methods.

The invention will now be detailed in a description of one embodiment, given below with reference to the accompanying drawings in which:

FIG. 1 is a schematic representation of an example of a diagonal type of quantum logic gate, associated with a state transition graph of qubits passing through this gate;

FIG. 2 is a schematic representation of an example of a conventional type of quantum logic gate, associated with a state transition graph of qubits passing through this gate;

FIG. 3 is a schematic representation of an example of a dense type of quantum logic gate, associated with a state transition graph of qubits passing through this gate;

FIG. 4 is a schematic representation of an example of a quantum logic circuit comprising a series of quantum logic gates, associated with a state transition graph of qubits successively traversing these logic gates.

The intent is to simulate, on a computer processing unit comprising a semiconductor integrated circuit, the operation of a (any) model of a quantum circuit configured for processing a predefined number n of qubits entering this circuit.

The expression "computer processing unit comprising a semiconductor integrated circuit" designates any processor (also called a microprocessor) comprising sets of transistors obtained according to conventional techniques of purification, etching, doping of semiconductor materials (such as silicon), and each able to be traversed (or not traversed, depending on the state of the transistor) by a flow of electric current that can be modeled by the laws of classical physics (particularly Ohm's law).

A transistor outputs a signal whose value, determined by the state of the transistor, is by convention equal to 0 or 1. This value is allocated to a binary numbering unit called a bit, which is the basis of coding in the classical computers known (and used) by the general public.

Theoretical advances made possible in particular by Hilbert, Dirac, and Schrödinger have opened a field of investigation aimed at designing a quantum computer, in other words a computer whose basic component would be miniaturized to the nanometric or even atomic scale, and at this scale we would no longer see the passage of the flows of current as we can in known transistors, but of single electrons, which each provide the value of a bit (0 or 1).

Since the electron, considered by itself, has a behavior that no longer obeys the classical laws of physics but the laws of quantum mechanics which are probabilistic by nature, the component in question outputs a signal whose value is indeterminate but is however possible to describe by means of mathematical tools developed for quantum mechanics, and in particular by means of the equation relating the state (or wave function) referred to as superposition which the particle (here the electron) is in.

We will not explain here the exact nature of the physical phenomena at work (in particular concerning the spin, the position, and the momentum of the electron), because this is not only off topic, it also remains under debate within the scientific community.

However, we will introduce certain physical and mathematical concepts necessary for a reasoned explanation of the proposed simulation method, which also enable us to understand how this method performs better than the known simulation methods.

We use here the notation conventions adopted by the literature (see the references mentioned in the introduction). Thus, we denote as $|\psi\rangle$ the wave function (using Dirac's bra-ket notation) describing the state of the particle, or particles as we will see.

In dimension 2, for a simple particle called a qubit able to provide two values (0 and 1), the wave function (or state) of the qubit is written:

$$|\psi\rangle = \alpha|0\rangle + \beta|1\rangle$$

$|0\rangle$ and $|1\rangle$ represent, in bra-ket notation, the values 0 and 1 (or base state) of a classical bit, while expressing the fact that these values are probable (and not certain) values that can be adopted by the qubit, it being understood that, according to the laws of quantum mechanics, any measurement performed on a qubit (corresponding to a particle) definitively fixes its state.

$\alpha$ and $\beta$, referred to as "probability magnitudes" or "amplitude coefficients", are complex numbers that each relate the probability of occurrence of the corresponding value (respectively $|0\rangle$ for $\alpha$ and $|1\rangle$ for $\beta$), $\alpha$ and $\beta$ satisfying the following "normalization" relation:

$$|\alpha|^2 + |\beta|^2 = 1$$

The wave function (or state) $|\psi\rangle$ of a unit qubit can also be written as a vector (column matrix):

$$|\psi\rangle = \begin{pmatrix} \alpha \\ \beta \end{pmatrix}$$

In this notation, the states $|0\rangle$ and $|1\rangle$ are written as follows:

$$|0\rangle = \begin{pmatrix} 1 \\ 0 \end{pmatrix}$$

$$|1\rangle = \begin{pmatrix} 0 \\ 1 \end{pmatrix}$$

One could limit oneself to the study of a single qubit, since according to the literature it is theoretically capable of storing an infinite amount of information.

However, since it is inherently impossible to determine the initial value(s) of a qubit from its observed (i.e. measured) value, in the research done on the behavior of the quantum computer one generally considers a number n (n being an integer such that n≥2) of qubits taken together, for which the global state is determined by a generalized wave function $|\psi\rangle$.

In a Hilbert space of dimension n the wave function (or state) $|\psi\rangle$ is written:

$$|\psi\rangle = \sum_{i=0}^{2^n-1} \alpha_i |i\rangle$$

$|i\rangle$ represents, in bra-ket notation (Dirac notation) and in binary, the possible values (or base states) of the classical bit combinations.

The coefficients $\alpha_i$ are the probability amplitudes (or amplitude coefficients) of the occurrence of each of these values; they are complex numbers (in the mathematical sense of the term), which together satisfy the following relation:

$$\sum_{i=0}^{2^n-1} |\alpha_i|^2 = 1$$

with, for all i:

$$\alpha_i \in \{0;1\}$$

We have already presented the wave function $|\psi\rangle$ applied to a single qubit. For this very simple case, for notational clarity we will simply observe that $\alpha_0$ is denoted $\alpha$ and $\alpha_1$ is denoted $\beta$.

For two qubits (n=2):

$$|\psi\rangle = \alpha_0|00\rangle + \alpha_1|01\rangle + \alpha_2|10\rangle + \alpha_3|11\rangle$$

where:

$$|\alpha_0|^2 + |\alpha_1|^2 + |\alpha_2|^2 + |\alpha_3|^2 = 1$$

In vector notation:

$$|\psi\rangle = \begin{pmatrix} \alpha_0 \\ \alpha_1 \\ \alpha_2 \\ \alpha_3 \end{pmatrix}$$

For three qubits (n=3):

$$|\psi\rangle = \alpha_0|000\rangle + \alpha_1|001\rangle + \alpha_2|010\rangle + \alpha_3|011\rangle + \alpha_4|100\rangle + \alpha_5|101\rangle + \alpha_6|110\rangle + \alpha_7|111\rangle$$

where:

$$|\alpha_0|^2 + |\alpha_1|^2 + |\alpha_2|^2 + |\alpha_3|^2 + |\alpha_4|^2 + |\alpha_5|^2 + |\alpha_6|^2 + |\alpha_7|^2 = 1$$

In vector notation:

$$|\psi\rangle = \begin{pmatrix} \alpha_0 \\ \alpha_1 \\ \alpha_2 \\ \alpha_3 \\ \alpha_4 \\ \alpha_5 \\ \alpha_6 \\ \alpha_7 \end{pmatrix}$$

As we will see below, the method for simulating a quantum circuit which we will describe does not rely on a computational approach which takes into account the complex notations of the amplitude coefficients $\alpha_i$, but on a combinatorial approach which takes into account the set of possible values that the state vector $|\psi\rangle$ (meaning the wave function) can assume, while eliminating the improbable values of this state vector $|\psi\rangle$ as the qubits progress through the quantum circuit.

As a preliminary, let us observe that for two qubits (n=2, see above), the possible values that $|\psi\rangle$ can assume are:

$$\begin{pmatrix}1\\0\\0\\0\end{pmatrix};\begin{pmatrix}0\\1\\0\\0\end{pmatrix};\begin{pmatrix}0\\0\\1\\0\end{pmatrix};\begin{pmatrix}0\\0\\0\\1\end{pmatrix}$$

which respectively correspond to the following values for the two qubits taken together:

$$|00\rangle;|01\rangle;|10\rangle;|11\rangle;$$

For three qubits (n=3, see above), the possible values which $|\psi\rangle$ can assume are:

$$\begin{pmatrix}1\\0\\0\\0\\0\\0\\0\\0\end{pmatrix};\begin{pmatrix}0\\1\\0\\0\\0\\0\\0\\0\end{pmatrix};\begin{pmatrix}0\\0\\1\\0\\0\\0\\0\\0\end{pmatrix};\begin{pmatrix}0\\0\\0\\1\\0\\0\\0\\0\end{pmatrix};\begin{pmatrix}0\\0\\0\\0\\1\\0\\0\\0\end{pmatrix};\begin{pmatrix}0\\0\\0\\0\\0\\1\\0\\0\end{pmatrix};\begin{pmatrix}0\\0\\0\\0\\0\\0\\1\\0\end{pmatrix};\begin{pmatrix}0\\0\\0\\0\\0\\0\\0\\1\end{pmatrix}$$

which respectively correspond to the following values for the three qubits taken together:

$$|000\rangle;|001\rangle;|010\rangle;|011\rangle;|100\rangle;|101\rangle;|110\rangle;|111\rangle$$

A quantum circuit modifies the value of the $2^n$ qubit(s) which traverse it.

By convention, and for the rest of the description, the state of the qubits entering the circuit will be denoted $|\psi\rangle$ and the state of the qubits exiting it will be denoted $|\psi'\rangle$.

$|\psi\rangle$ and $|\psi'\rangle$ are related by a transfer function, performed by the quantum circuit and described by a matrix relation:

$$|\psi'\rangle = U \cdot |\psi\rangle$$

where U is a matrix, called the transfer matrix, of size $2^n \times 2^n$, corresponding to the transfer function applied by the quantum circuit to the incoming qubits. The transfer matrix U comprises operators $u_{xy}$, (x and y being integers, $0 \le x \le 2^n-1$, $0 \le y \le 2^n-1$) which are in the form of complex numbers (in the mathematical sense of the term). The transfer matrix U represents the set of operations applied by the quantum circuit to the incoming qubits, as described by their state vector $|\psi\rangle$.

Using the notation:

$$|\psi\rangle = \begin{pmatrix} \alpha_0 \\ \vdots \\ \alpha_{2^n-1} \end{pmatrix}$$

$$|\psi'\rangle = \begin{pmatrix} \alpha'_0 \\ \vdots \\ \alpha'_{2^n-1} \end{pmatrix}$$

$$U = \begin{pmatrix} u_{00} & \cdots & u_{0(2^n-1)} \\ \vdots & \ddots & \vdots \\ u_{(2^n-1)0} & \cdots & u_{(2^n-1)(2^n-1)} \end{pmatrix}$$

one can write the relation between $|\psi'\rangle$ and $|\psi\rangle$ as follows:

$$\begin{pmatrix} \alpha'_0 \\ \vdots \\ \alpha'_{2^n-2} \end{pmatrix} = \begin{pmatrix} u_{00} & \cdots & u_{0(2^n-1)} \\ \vdots & \ddots & \vdots \\ u_{(2^n-1)0} & \cdots & u_{(2^n-1)(2^n-1)} \end{pmatrix} \times \begin{pmatrix} \alpha_0 \\ \vdots \\ \alpha_{2^n-2} \end{pmatrix}$$

For a classical computer to count the set of possible states of the qubits exiting the circuit, even in linear algebra, this requires very significant resources when the number of incoming qubits is high. In fact, the memory space required increases exponentially with the number of qubits to be processed.

We therefore wish to avoid having to construct the entire transfer matrix U (corresponding to the quantum circuit studied) and having to perform the matrix calculation $|\psi'\rangle = U \cdot |\psi\rangle$.

For this purpose, the inventors first had the idea of subdividing the quantum circuit into several adjacent successive layers which the set of qubits entering the circuit pass through and each containing a predetermined basic quantum logic gate each performing an operation, also predetermined, on one or more of the qubits entering the layer (but not necessarily on all of them).

We denote as d (d being an integer such that $d \ge 2$) the number of basic quantum logic gates of the circuit. It is declared that $d \ge 2$ because a basic logic gate corresponds to a simple matrix operation whose result is easily solved by known simulations.

We denote as k the index of each layer (k being an integer such that $1 \le k \le d$), which is assigned to the letter L in order to designate as $L_k$ the $k^{th}$ layer and to the letter G in order to designate as $G_k$ the $k^{th}$ unitary logic gate contained in layer $L_k$.

The literature (for example see Nielsen & Chuang, op. cit.) Has defined a number of basic quantum logic gate models, each associated with a specific transfer matrix.

We can cite as examples:
the Hadamard gate, denoted H, which applies its transfer function to a single qubit and is defined as follows:

$$H \triangleq \frac{1}{\sqrt{2}} \begin{pmatrix} 1 & 1 \\ 1 & -1 \end{pmatrix}$$

the Pauli gates, denoted by X (or NOT), Y and Z, which apply their transfer functions (respectively a permutation and two rotations of angle $\pi$) to a single qubit and are respectively defined as follows:

$$X(NOT) \triangleq \begin{pmatrix} 0 & 1 \\ 1 & 0 \end{pmatrix}$$

-continued $$Y \triangleq \begin{pmatrix} 0 & -i \\ i & 0 \end{pmatrix}$$

$$Z \triangleq \begin{pmatrix} 1 & 0 \\ 0 & -1 \end{pmatrix}$$

the "Controlled-NOT" gate, denoted by CNOT, which applies its transfer function (an inversion) to two qubits and is defined as follows:

$$CNOT \triangleq \begin{pmatrix} 1 & 0 & 0 & 0 \\ 0 & 1 & 0 & 0 \\ 0 & 0 & 0 & 1 \\ 0 & 0 & 1 & 0 \end{pmatrix}$$

the SWAP gate (or qSWAP), which applies its transfer function (a permutation) to two qubits and is defined as follows:

$$qSWAP \triangleq \begin{pmatrix} 1 & 0 & 0 & 0 \\ 0 & 0 & 1 & 0 \\ 0 & 1 & 0 & 0 \\ 0 & 0 & 0 & 1 \end{pmatrix}$$

the controlled phase gate, denoted by $R_\phi$, associated with an angle denoted by $\phi$ (in the notation used to describe the qubit on the Bloch sphere), which applies its transfer function (a rotation of angle $\phi$) to a single qubit and is defined as follows:

$$R_\phi \triangleq \begin{pmatrix} 1 & 0 & 0 & 0 \\ 0 & 1 & 0 & 0 \\ 0 & 0 & 1 & 0 \\ 0 & 0 & 0 & e^{i\phi} \end{pmatrix}$$

To facilitate the simulation of any quantum circuit, the inventors then had the idea of classifying the different basic gate models (which can be used to configure the quantum circuit) into three types:

Diagonal type gate, for which the matrix is diagonal;
Conventional type gate, for which the matrix is non-diagonal and includes operators having a value of 0 or 1, with only one operator being equal to 1 per row and per column;
Dense type gate, which is neither conventional nor diagonal in type.

According to this classification:

Z, $R_\phi$ in particular are diagonal type gates;
X, Y, CNOT, SWAP, in particular are conventional type gates;
H in particular is a dense type gate.

To further facilitate the simulation, the inventors next had the idea of minimizing the operations performed on the qubits traveling through each layer $L_k$ of the quantum circuit, by simplifying as much as possible the calculations resulting from applying the transfer function carried out by the basic logic gate $G_k$ residing in this layer, starting from the following triple postulate:

For any state vector $|\psi_k\rangle$ of the n qubits entering the gate, considered according to its possible values in other words the state vector $|\psi_k\rangle$ in the form of a column matrix comprising $2^n-1$ amplitude coefficients of value 0 and a single amplitude coefficient of value 1 (see examples provided below):

1) A diagonal type logic gate does not modify the value of the state vector (considered according to its possible values)—this is particularly the case for Pauli gate Z and the controlled phase gates $R_\phi$, because a diagonal matrix does not affect the value of the amplitude coefficients of the state vector of the incoming qubits;

2) A conventional type logic gate performs a single possible transformation of the state vector $|\psi_k\rangle$ of the incoming qubits—this is particularly the case for the X (NOT), Y, CNOT and SWAP gates—because a non-diagonal matrix comprising operators equaling 0 or 1 with one operator of value 1 per row and per column shifts the amplitude coefficient $\alpha_c$ of value 1, from rank i=c where this coefficient is located in the state vector $|\psi_k\rangle$ of the incoming qubits), to rank 1 in the state vector $|\psi_{k+1}\rangle$ of the outgoing qubits;

3) A dense type logic gate performs several possible transformations of the state vector $|\psi_k\rangle$ of the incoming qubits—this is particularly the case for the matrix H, since its matrix comprises non-zero values in at least one row and/or column.

This triple postulate makes it possible to simplify the calculations considerably during simulation of the passage of each gate by the n qubits, because it allows eliminating—in other words not taking into account—the improbable values of the state vector $|\psi_{k+1}\rangle$ exiting the gate, only retaining (and storing in a dedicated memory register) the probable values.

To illustrate this, let us apply this postulate for each type of logic gate, respectively referring to FIG. 1, FIG. 2, and FIG. 3, where various basic quantum gates have been represented using known representation rules (described in particular in Nielsen & Chuang, op. cit.), in which the path of each qubit is represented by a horizontal line and each basic quantum gate is superimposed on a line. A vertical line leading to a point on a line other than the one on which the gate is located means that the gate is controlled by the qubit represented by this other line.

FIG. 1 shows a circuit comprising a single basic quantum gate of the diagonal type, traversed by a single qubit: this is a controlled phase $$R_{\frac{\pi}{2}},$$

which applies a rotation of angle $$\frac{\pi}{2}$$

to the qubit that traverses it.

Under the gate, the four possible states of the input qubits $|00\rangle$, $|01\rangle$, $|10\rangle$ and $|11\rangle$ have been represented in superimposed boxes; and, level with these, the four possible states of the output qubits: $|00\rangle$, $|01\rangle$, $|10\rangle$ and $|11\rangle$.

If the input state is |00⟩, then the only possible value of the output state is also |00⟩, the other possible values (|01⟩, |10⟩ and |11⟩) being improbable and able to be ignored: the corresponding boxes are grayed out to illustrate the abandonment of these calculation hypotheses.

For illustrative purposes, the state transition |0⟩ → |0⟩ is represented by a horizontal arrow, which indicates that the quantum gate considered does not modify the value of the qubits processed.

FIG. 2 shows a circuit comprising a single basic quantum gate of the conventional type, traversed by a single qubit: this is an X gate.

Under the gate, the two possible states of the input qubit |0⟩ and |1⟩ have been represented in superimposed boxes; and, level with these, the two possible values of the output qubit: |0⟩ and |1⟩.

If the state of the input qubit is |0⟩, then the only possible state of the output qubit is |1⟩, the other possible value |0⟩ being improbable and able to be ignored: the corresponding box appears grayed out.

Conversely, if the state of the input qubit is |1⟩, then the only possible state of the output qubit would be |0⟩, the other possible state |1⟩ being improbable (and able to be ignored).

For illustrative purposes, the state transition |0⟩ → |1⟩ is represented by an oblique arrow, which indicates that the quantum gate considered modifies the state of the incoming qubit by assigning it the only other possible state.

FIG. 3 shows a circuit comprising a single basic quantum gate of the dense type, traversed by a single qubit: this is an H (Hadamard) gate.

Under the gate the two possible states of the input qubit |0⟩ and |1⟩ have been represented in superimposed boxes; and, level with these, the two possible values of the output qubit: |0⟩ and |1⟩.

Regardless of the state of the input qubit, |0⟩ or |1⟩, it is equiprobable that its output state is |0⟩ (state unchanged) or |1⟩ (state changed).

Assuming the state of the input qubit is |0⟩, for illustrative purposes the two possible state transitions are represented by two arrows originating from box |0⟩: one horizontally towards |0⟩, signifying the possibility of maintaining the state of the qubit, the other diagonally towards |1⟩, signifying the possibility of a change of state of the qubit.

These illustrative conventions allow illustrating, in graph form, the simulation method employed. This method is now described in detail with reference to an example shown in FIG. 4.

It is assumed that before beginning the simulation, there is a library of predefined quantum gate models stored in a semiconductor integrated circuit memory, each quantum gate model being associated with a transfer matrix $U_k$ comprising operators ordered into rows and columns and defining the set of possible state transitions of the qubits passing through this gate.

The simulation comprises a first phase of configuration, which comprises the operations of:
  defining the number n of qubits to be processed as input to the quantum circuit model—for example n=3;
  selecting the d quantum gate models, for example three Hadamard gates, two gates $R_{\frac{\pi}{2}}$ and one gate $R_{\frac{\pi}{4}}$;

arranging the d quantum gate models thus selected so as to construct the quantum circuit model—for example, as illustrated in FIG. 4, a circuit modeling a Quantum Fast Fourier Transform (QFFT).

Once the quantum circuit to be simulated is thus configured, the simulation comprises a second phase of analyzing the quantum circuit model thus configured, which comprises the operations of:
  dividing the quantum circuit into d adjacent layers $L_k$ intended to be successively traversed by the n qubits taken together, each layer comprising a single basic quantum gate—thus, in the example of FIG. 4, where d=6:

$$L_1 \triangleq G_1 = H$$
$$L_2 \triangleq G_2 = R_{\frac{\pi}{2}}$$
$$L_3 \triangleq G_3 = H$$
$$L_4 \triangleq G_4 = R_{\frac{\pi}{4}}$$
$$L_5 \triangleq G_5 = R_{\frac{\pi}{2}}$$
$$L_6 \triangleq G_6 = H$$

assigning a type to each quantum gate of the circuit, among three predefined types of quantum gates:
    Diagonal type gate, for which the matrix is diagonal—in the example of FIG. 4, this is the case for $G_2$, $G_4$ and $G_5$;
    Conventional type gate, for which the matrix is non-diagonal and includes operators having a value of 0 or 1, with only one operator per row and per column (none of the gates in the example of FIG. 4);
    Dense type gate, which is neither conventional nor diagonal in type—in the example of FIG. 4, this is the case for $G_1$, $G_3$ and $G_6$.

Once this analysis is complete, the simulation comprises a third phase of calculation, which comprises the repetition, for j=1 to j=$2^n$ (j being an integer; in the example of FIG. 4, n=3 such that j varies from 1 to $2^3$=8), of the following operations:

a) defining a state vector $|\psi_j\rangle$ of the n qubits entering the quantum circuit in the example of FIG. 4 the vector $|\psi_j\rangle$ can assume each of the following eight states:

$$\begin{pmatrix}1\\0\\0\\0\\0\\0\\0\\0\end{pmatrix};\begin{pmatrix}0\\1\\0\\0\\0\\0\\0\\0\end{pmatrix};\begin{pmatrix}0\\0\\1\\0\\0\\0\\0\\0\end{pmatrix};\begin{pmatrix}0\\0\\0\\1\\0\\0\\0\\0\end{pmatrix};\begin{pmatrix}0\\0\\0\\0\\1\\0\\0\\0\end{pmatrix};\begin{pmatrix}0\\0\\0\\0\\0\\1\\0\\0\end{pmatrix};\begin{pmatrix}0\\0\\0\\0\\0\\0\\1\\0\end{pmatrix};\begin{pmatrix}0\\0\\0\\0\\0\\0\\0\\1\end{pmatrix}$$

which, in bra-ket notation (used in FIG. 4) can be denoted respectively:

$$|000\rangle;|001\rangle;|010\rangle;|011\rangle;|100\rangle;|101\rangle;|110\rangle;|111\rangle$$

(stacked in superimposed boxes in FIG. 4)
b) repeating the following sequence, for k=1 to k=d (here for k=1 to k=6):
  b1) taking into account a possible state vector $|\psi_k^j\rangle$ of the n qubits entering layer $L_k$, this vector $|\psi_k^j\rangle$ comprising a series of $2^n$ amplitude coefficients $\alpha_i^{j,k}$—thus, in the case of FIG. 4, for j=1 and k=1, the state of the n qubits entering layer $L_1$ is $|000\rangle$, the other states being grayed out to indicate that they are not considered in this iteration on k;
  b2) identifying the gate $G_k$ comprised in layer $L_k$—in the example of FIG. 4, $$G_1 = H; G_2 = R_{\frac{\pi}{2}}; G_3 = H; G_4 = R_{\frac{\pi}{4}}; G_5 = R_{\frac{\pi}{2}}; G_6 = H;$$

b3) taking into account the type of gate $G_k$ (in the example of FIG. 4, and for k=1: dense gate; for k=2: diagonal gate; for k=3: dense gate; for k=4: diagonal gate; for k=5: diagonal gate; for k=6: dense gate;
  b4) if gate $G_k$ is of the diagonal type ($G_2$, $G_4$, $G_5$ in the example of FIG. 4), assigning to the state vector $|\psi_{k+1}^j\rangle$ of the n qubits exiting layer $L_k$ the value of the state vector $|\psi_k^j\rangle$ of the n qubits entering it:

$$|\psi_{k+1}^j\rangle = |\psi_k^j\rangle$$

In the example of FIG. 4, the horizontal arrows joining the unshaded boxes on either side of gates $G_2$, $G_4$, and $G_5$ illustrate the identity of the input and output states;
  b5) if the gate $G_k$ is of the conventional type:
    detecting in its transfer matrix each operator having a value of 1 and determining its row number l and its column number c (l and c being integers such that $0 \leq l \leq 2^n$, $0 \leq c \leq 2^n$ and $l \neq c$);
    assigning the following values to the amplitude coefficients $\alpha_i^{j,k+1}$ of the state vector $|\psi_{k+1}^j\rangle$ of the n qubits exiting layer $L_k$:

$$\alpha_i^{j,k+1} = \alpha_i^{j,k} \text{ for all } i \neq l$$

$$\alpha_l^{j,k+1} = \alpha_c^{j,k}$$

storing the vector $|\psi_{k+1}^j\rangle$ in a dedicated register of a semiconductor integrated circuit memory, which makes it possible to perform each calculation step in parallel;
  b6) if the gate $G_k$ is of the dense type:
    determining the set of possible values of the state vector $|\psi_{k+1}^j\rangle$ of the n qubits exiting layer $L_k$ such that:

$$|\psi_{k+1}^j\rangle = U_k \cdot |\psi_k^j\rangle$$

Thus, in the example of FIG. 4, we see that for gates $G_1$, $G_3$ and $G_6$, the qubit entering the Hadamart gate can take any output value, while the other two bits are unchanged: this explains why two arrows start from the box containing the possible state of the qubits entering the gate and end at the only two possible gate output states, according to the value of the qubit affected by the transfer function of the gate: in the case for example of gate $G_3$, which affects the second qubit only, and starting with input state $|000\rangle$, the only two possible output states are $|000\rangle$ and $|010\rangle$; the other states are improbable and are ignored in the subsequent steps of the simulation;
    storing each possible value of the vector $|\psi_{k+1}^j\rangle$ in a dedicated register of a semiconductor integrated circuit memory, which at this stage allows continuing in parallel the sub-calculations resulting from the previous calculations;
c) when the previous iterations are completed, aggregating, in a single register of a semiconductor integrated circuit memory, the set of possible states of the vector $|\psi_{d+1}^j\rangle$ (stored in separate registers, as we have just seen).

The fact of ignoring the improbable states of the qubits at each gate passage considerably reduces the number of iterations (and therefore the computing time and power), as well as the memory space (conventional type) required.

To illustrate these advantages, the simulation just described was able to be conducted on a circuit of the type in FIG. 4 (Quantum Fast Fourier Transform), for n=18 to n=24.

In comparison to known algorithms, the simulation was able to be accelerated by a factor comprised between 20 and 40.

More specifically, by denoting as N the available memory capacity of the computer on which the simulation is performed, the method makes it possible to process a maximum number $n_m$ of qubits greater than:

$$\frac{\log(N)}{\log(2)}$$

This number is greater by a factor of 2 than known numbers, with equivalent memory capacity.

The invention claimed is:
1. A method for simulating, on a computer processing unit comprising a semiconductor integrated circuit, operation of a quantum circuit model configured to process a predefined number n (n being an integer such that n≥2) of input qubits and comprising a series of d (d being an integer such that d≥2) basic quantum gates $G_k$ (k being an integer, 1≤k≤d) selected from a library of predefined quantum gate models stored in a semiconductor integrated circuit memory, each quantum gate model being associated with a transfer matrix $U_k$ comprising operators ordered in rows and columns and defining a set of possible state transitions of qubits passing through a gate, this method comprising:
  a phase of-configuring a quantum circuit, which comprises:
    defining a number n of qubits to be processed as input to the quantum circuit model;
    selecting d quantum gate models;
    arranging the d quantum gate models thus selected so as to construct the quantum circuit model;
  a phase of analyzing the quantum circuit model as configured, which comprises:
    dividing the quantum circuit into d adjacent layers $L_k$ to be traversed by the n qubits taken together, each layer comprising a single quantum gate;
    assigning a type to each quantum gate of the quantum circuit, among three predefined types of quantum gates:
      a diagonal type gate, for which the transfer matrix is diagonal;
      a conventional type gate, for which the transfer matrix is non-diagonal and comprises operators having a value of 0 or 1, with only one operator per row and per column;

a dense type gate, which is neither conventional nor diagonal in type;

a phase of calculation, which comprises repetition, for j=1 to j=$2^n$ (j being an integer), of:

a) defining a state vector $|\psi_j\rangle$ of then qubits entering the quantum circuit, which comprises a series of $2^n$ amplitude coefficients $\alpha_i^j$ (i being an integer, $0 \leq i \leq 2^n-1$) having a value of 0 or 1, and such that:

$$\sum_{i=0}^{2^n-1} |\alpha_i^j|^2 = 1$$

b) repeating a sequence, for k=1 to k=d, the sequence comprising:

b1) taking into account a state vector $|\psi_k^j\rangle$ of the n qubits entering layer $L_k$, state vector $|\psi_k^j\rangle$ comprising a series of $2^n$ amplitude coefficients $\alpha_i^{j,k}$;

b2) identifying the gate $G_k$ comprised in layer $L_k$;

b3) taking into account a type of the gate $G_k$;

b4) if the gate $G_k$ is of the diagonal type, assigning to a state vector $|\psi_{k+1}^j\rangle$ of the n qubits exiting layer $L_k$ a value of state vector $|\psi_k^j\rangle$ of the n qubits entering it:

$$|\psi_{k+1}^j\rangle = |\psi_k^j\rangle$$

b5) if the gate $G_k$ is of the conventional type:

detecting in its transfer matrix each operator having a value of 1 and determining its row number l and its column number c (l and c being integers such that $0 \leq l \leq 2^n$, $0 \leq c \leq 2^n$ and $l \neq c$);

assigning values to amplitude coefficients $\alpha_i^{j,k+1}$ of state vector $|\psi_{k+1}^j\rangle$ of the n qubits exiting layer $L_k$, the values comprising:

$\alpha_i^{j,k+1} = \alpha_i^{j,k}$ for all $i \neq l$ $\alpha_l^{j,k+1} = \alpha_c^{j,k}$ storing state vector $|\psi_{k+1}^j\rangle$ in a dedicated register of a semiconductor integrated circuit memory;

b6) if the gate $G_k$ is of the dense type:

determining a set of possible values of state vector $|\psi_{k+1}^j\rangle$ of the n qubits exiting layer $L_k$ such that:

$$|\psi_{k+1}^j\rangle = U_k \cdot |\psi_k^j\rangle$$

storing each possible value of state vector $|\psi_{k+1}^j\rangle$ in a dedicated register of a semiconductor integrated circuit memory;

c) aggregating, in a single register of a semiconductor integrated circuit memory, a set of possible states of a state vector $|\psi_{d+1}^j\rangle$.

* * * * *